(12) United States Patent
Lafarre et al.

(10) Patent No.: US 10,126,663 B2
(45) Date of Patent: *Nov. 13, 2018

(54) SUBSTRATE HOLDER, LITHOGRAPHIC APPARATUS, DEVICE MANUFACTURING METHOD, AND METHOD OF MANUFACTURING A SUBSTRATE HOLDER

(71) Applicant: ASML NETHERLANDS B.V., Veldhoven (NL)

(72) Inventors: Raymond Wilhelmus Louis Lafarre, Helmond (NL); Nina Vladimirovna Dziomkina, Eindhoven (NL); Yogesh Pramod Karade, Eindhoven (NL); Elisabeth Corinne Rodenburg, Heeze (NL); Peter Van Delft, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/823,247

(22) Filed: Nov. 27, 2017

(65) Prior Publication Data

US 2018/0081284 A1 Mar. 22, 2018

Related U.S. Application Data

(63) Continuation of application No. 15/131,986, filed on Apr. 18, 2016, now Pat. No. 9,829,803, which is a (Continued)

(51) Int. Cl.
*G03F 7/20* (2006.01)
*B05D 1/00* (2006.01)

(52) U.S. Cl.
CPC ......... *G03F 7/70716* (2013.01); *B05D 1/005* (2013.01); *G03F 7/707* (2013.01); *G03F 7/70341* (2013.01); *G03F 7/70691* (2013.01)

(58) Field of Classification Search
CPC ................................................. G03F 7/70708
See application file for complete search history.

(56) References Cited

U.S. PATENT DOCUMENTS 5,946,183 A 8/1999 Yamada et al.
7,161,662 B2 1/2007 Ottens et al.
(Continued)

FOREIGN PATENT DOCUMENTS

JP H05-047909 2/1993
JP 2010-161319 7/2010
(Continued)

OTHER PUBLICATIONS

Japanese Office Action dated Sep. 16, 2016 in corresponding Japanese Patent Application No. 2014-147330.
(Continued)

*Primary Examiner* — Steven H Whitesell Gordon
(74) *Attorney, Agent, or Firm* — Pillsbury Winthrop Shaw Pittman, LLP

(57) ABSTRACT

A substrate holder for a lithographic apparatus has a planarization layer provided on a surface thereof. The planarization layer provides a smooth surface for the formation of a thin film stack forming an electronic component. The planarization layer is of substantially uniform thickness and/or its outer surface has a peak to valley distance of less than 10 μm. The planarization layer may be formed by applying two solutions of different concentration. A surface treatment may be applied to the burls to repel a solution of the planarization layer material.

20 Claims, 11 Drawing Sheets

Related U.S. Application Data continuation of application No. 13/648,069, filed on Oct. 9, 2012, now Pat. No. 9,316,927.

(60) Provisional application No. 61/547,600, filed on Oct. 14, 2011.

(56) References Cited

U.S. PATENT DOCUMENTS

| | | |
|---|---|---|
| 7,327,439 B2 | 2/2008 | Zaal et al. |
| 7,524,735 B1 | 4/2009 | Gauri et al. |
| 7,940,511 B2 | 5/2011 | Sijben |
| 9,316,927 B2 | 4/2016 | Lafarre et al. |
| 2004/0029041 A1 | 2/2004 | Shih et al. |
| 2004/0055709 A1 | 3/2004 | Boyd et al. |
| 2004/0114124 A1 | 6/2004 | Hoeks et al. |
| 2004/0206267 A1 | 10/2004 | Sambasivan et al. |
| 2004/0207824 A1 | 10/2004 | Lof et al. |
| 2005/0030515 A1 | 2/2005 | Ottens et al. |
| 2006/0038968 A1 | 2/2006 | Kemper et al. |
| 2006/0102277 A1 | 5/2006 | Zaal et al. |
| 2007/0146679 A1 | 6/2007 | Sutedja et al. |
| 2008/0212046 A1 | 9/2008 | Riepen et al. |
| 2009/0079525 A1* | 3/2009 | Sijben ............... G03F 7/70708 335/72 |
| 2009/0080136 A1 | 3/2009 | Nagayama et al. |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2010/0213493 A1* | 8/2010 | Hsu ..................... H01L 33/22 257/98 |
| 2011/0210957 A1 | 9/2011 | Koyama et al. |
| 2011/0222032 A1 | 9/2011 | Ten Kate et al. |
| 2011/0222033 A1 | 9/2011 | Ten Kate et al. |
| 2011/0228248 A1 | 9/2011 | Lafarre et al. |
| 2012/0147353 A1 | 6/2012 | Lafarre et al. |
| 2012/0212725 A1 | 8/2012 | Lafarre et al. |
| 2012/0274920 A1 | 11/2012 | Bex et al. |
| 2013/0189802 A1 | 7/2013 | Tromp et al. |

FOREIGN PATENT DOCUMENTS

| | | |
|---|---|---|
| JP | 2010-541196 | 12/2010 |
| JP | 2011-205093 | 10/2011 |
| JP | 2012-129524 | 7/2012 |
| JP | 2012-235095 | 11/2012 |
| WO | 99/49504 | 9/1999 |
| WO | 2005/091356 | 9/2005 |
| WO | 2012/005294 | 1/2012 |
| WO | 2013/113568 | 8/2013 |
| WO | 2013/113569 | 8/2013 |
| WO | 2013/156236 | 10/2013 |

OTHER PUBLICATIONS

Notice of Reasons for Refusal issued in corresponding Japanese Patent Application No. 2014-147330 dated Jun. 5, 2017.

* cited by examiner

SUBSTRATE HOLDER, LITHOGRAPHIC APPARATUS, DEVICE MANUFACTURING METHOD, AND METHOD OF MANUFACTURING A SUBSTRATE HOLDER

This application is a continuation of U.S. patent application Ser. No. 15/131,986, filed Apr. 18, 2016, now allowed, which is a continuation of U.S. patent application Ser. No. 13/648,069, filed Oct. 9, 2012, now U.S. Pat. No. 9,316,927, which claims priority and benefit under 35 U.S.C. § 119(e) to U.S. Provisional Patent Application No. 61/547,600, filed on Oct. 14, 2011. The entire content of each of the foregoing applications is incorporated herein in its entirety by reference.

FIELD

The present invention relates to a substrate holder, a lithographic apparatus, a device manufacturing method, and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, a laser-produced plasma source, a discharge plasma source, or a source based on synchrotron radiation provided by an electron storage ring.

EUV radiation may be produced using a plasma. A radiation system to produce EUV radiation may include a laser to excite a fuel to provide the plasma, and a source collector apparatus to contain the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. A purpose of spacing apart the substrate, substrate holder and substrate table is to reduce Van der Waals and/or electrostatic forces which might hold the substrate down and thus reduce the force to release the substrate. An additional or alternative purpose is to help prevent a particle (e.g. a contaminating particle such as a dust particle), which might be present on either the substrate table or substrate holder, from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

It is desirable to provide a thin-film electric component, e.g. one or more electrodes, heaters and/or sensors, on the substrate holder. An electrode can be used, for example, for electrostatic clamping of the substrate. A heater and/or sensor can be used, for example, for temperature control over a substrate area. A thin-film stack comprising several components is desirable to effect multiple functions. To form a reliable thin-film component, especially a thin film stack, a suitably flat surface should be used.

A substrate holder is desirably made of a material having a low coefficient of thermal expansion (CTE) such as SiSiC. In order to form the burls, material is selectively removed from a flat disc (a blank), e.g. by electric discharge machining (EDM). This process leaves a surface that is often too rough to form a reliable thin-film component; the conductive layer and/or dielectric suffers from pinholes. It has therefore been proposed to provide a planarization layer on the substrate holder between the burls. The planarization layer is proposed to be a polymer layer, e.g. formed by spraying of a benzocyclobutene (BCB) solution which is then cured.

It is desirable, for example, to provide a substrate table or substrate holder on which one or more electronic components, such as one or more thin-film components, are formed.

According to an aspect of the invention, there is provided a substrate holder for use in a lithographic apparatus, the substrate holder comprising: a main body having a surface; a plurality of burls projecting from the surface and having end surfaces to support a substrate; a planarization layer provided on at least part of the main body surface; and a thin film stack provided on the planarization layer and forming an electric component, the planarization layer having an outer surface having a peak to valley distance of less than about 10 µm.

According to an aspect of the invention, there is provided a lithographic apparatus, comprising: a support structure configured to support a patterning device; a projection system arranged to project a beam patterned by the patterning device onto a substrate; and a substrate holder arranged to hold the substrate, the substrate holder being as described herein.

According to an aspect of the invention, there is provided a device manufacturing method using a lithographic apparatus, the method comprising: projecting a beam patterned by a patterning device onto a substrate while holding the substrate in a substrate holder, wherein the substrate holder comprises: a main body having a surface; a plurality of burls projecting from the surface and having end surfaces to support a substrate; a planarization layer provided on at least part of the main body surface; and a thin film stack provided on the planarization layer and forming an electric component, the planarization layer having an outer surface having a peak to valley distance of less than about 10 µm.

According to an aspect of the invention, there is provided a method of manufacturing a substrate holder for use in a lithographic apparatus, the method comprising: providing a main body having a surface and a plurality of burls projecting from the surface and having end surfaces to support a substrate; forming a planarization layer on at least part of the main body surface; and forming a thin film stack on the planarization layer, the thin film stack forming an electric component and the planarization layer having an outer surface having a peak to valley distance of less than about 10 µm.

According to an aspect of the invention, there is provided a substrate holder for use in a lithographic apparatus, the substrate holder comprising: a main body having a surface; a plurality of burls projecting from the surface and having end surfaces to support a substrate; a planarization layer provided on at least part of the main body surface; and a thin film stack provided on the planarization layer and forming an electric component, the planarization layer having a substantially uniform thickness.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
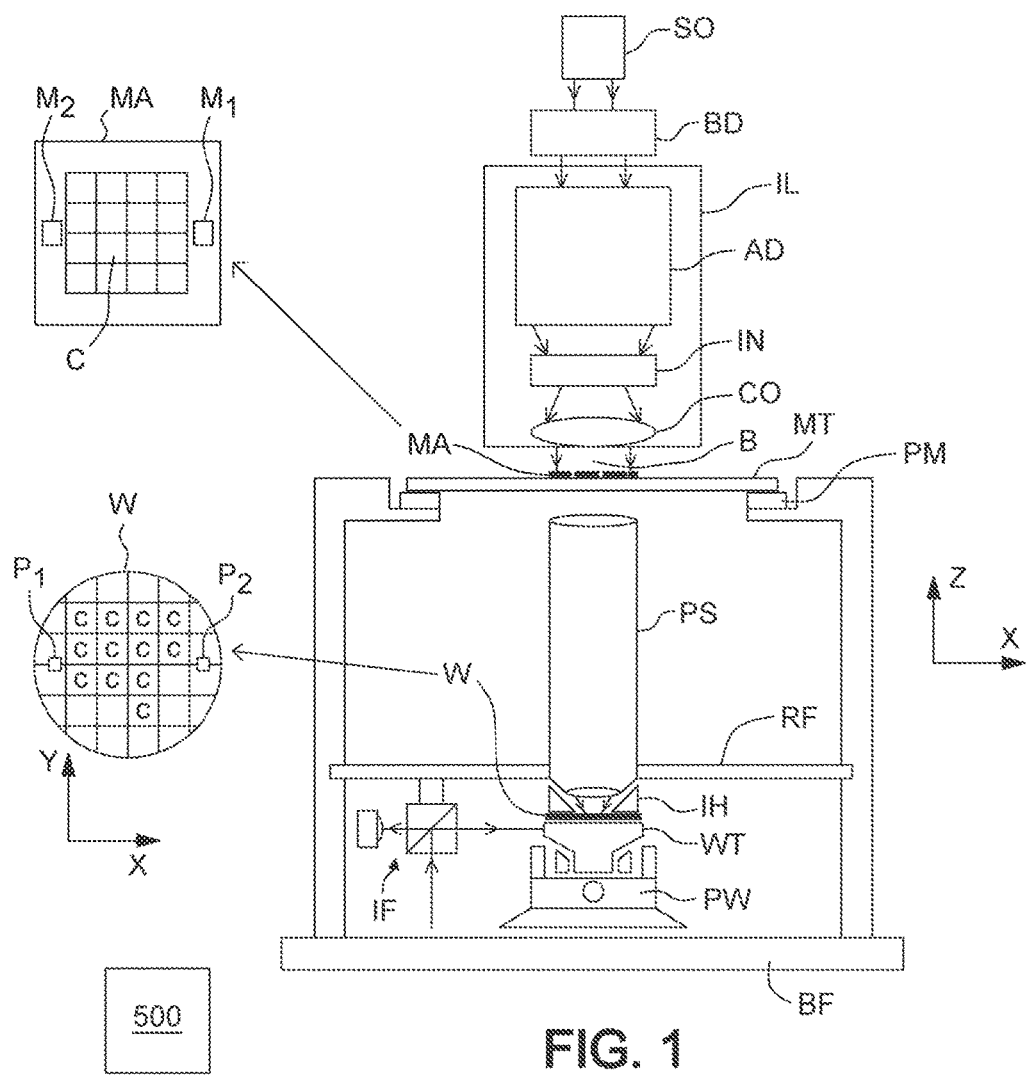
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation, DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

Figure 29:
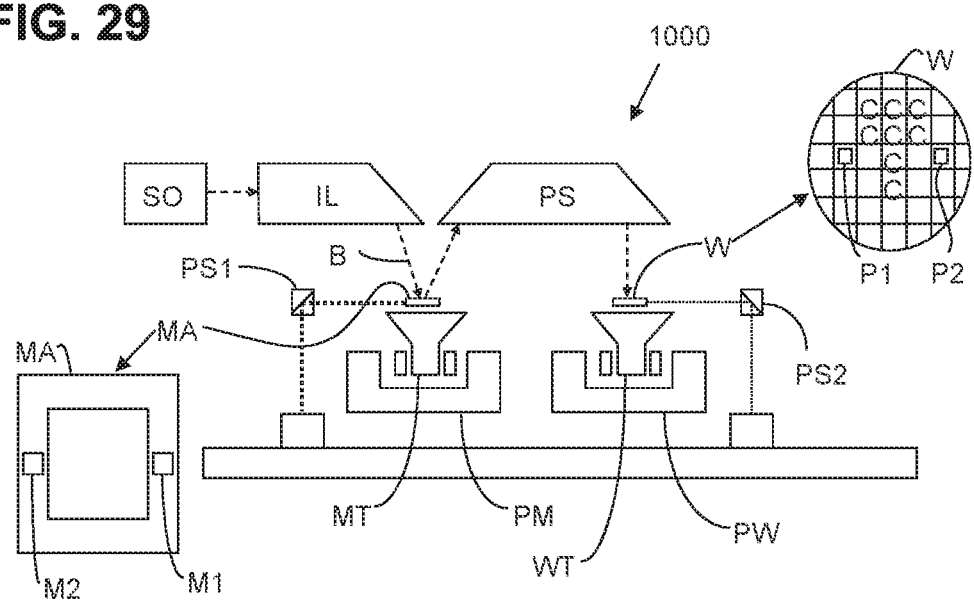
FIG. 29 depicts a lithographic apparatus according to an embodiment of the invention.

FIG. 29 schematically depicts a lithographic apparatus 1000 including a source collector apparatus SO according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W. As here depicted, the apparatus is of a reflective type (e.g. employing a reflective mask).

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

Referring to FIG. 29, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the required line-emitting element, with a laser beam. The source collector apparatus SO may be part of an EUV radiation system including a laser, not shown in FIG. 29, to provide the laser beam exciting the fuel. The resulting plasma emits output radiation, e.g., EUV radiation, which is collected using a radiation collector, disposed in the source collector apparatus.

The laser and the source collector apparatus may be separate entities, for example when a $CO_2$ laser is used to provide the laser beam for fuel excitation. In such cases, the laser is not considered to form part of the lithographic apparatus and the radiation beam is passed from the laser to the source collector apparatus with the aid of a beam delivery system comprising, for example, one or more suitable directing mirrors and/or a beam expander. In other cases the source may be an integral part of the source collector apparatus, for example when the source is a discharge produced plasma EUV generator, often termed as a DPP source.

The illuminator IL may comprise an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

Figure 30:
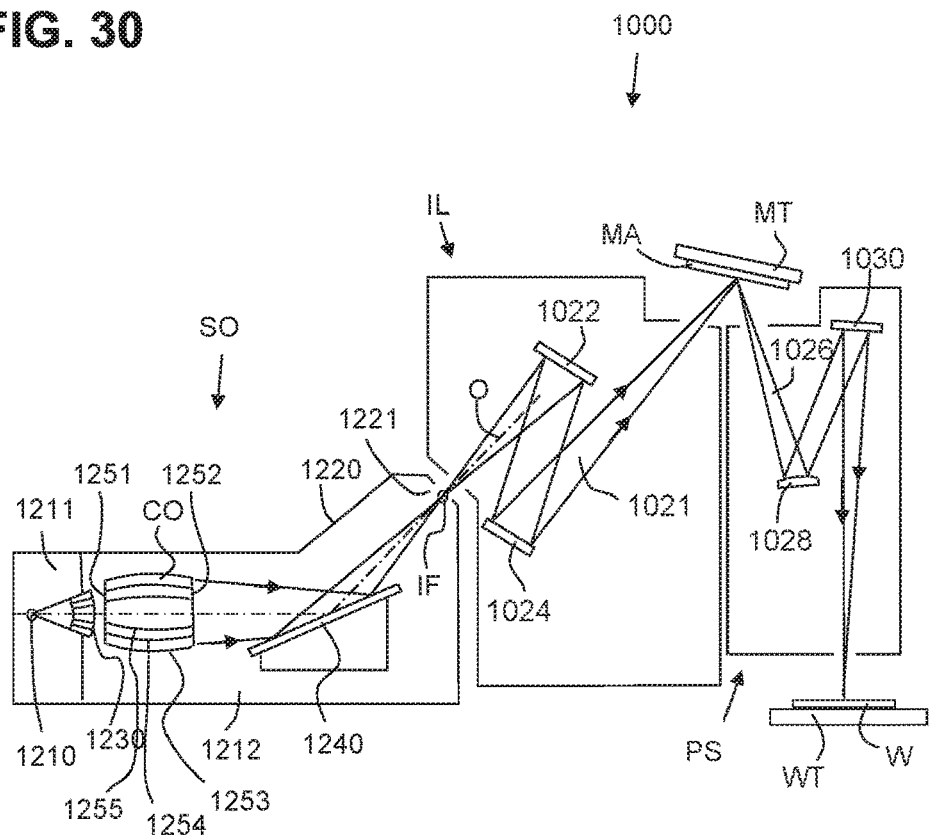
FIG. 30 is a more detailed view of the apparatus of FIG. 29.

FIG. 30 shows an embodiment of the apparatus 1000 in more detail, including the source collector apparatus SO, the illumination system IL, and the projection system PS. The source collector apparatus SO is constructed and arranged such that a vacuum environment can be maintained in an enclosing structure 1220 of the source collector apparatus SO. An EUV radiation emitting plasma 1210 may be formed by a discharge produced plasma source. EUV radiation may be produced by a gas or vapor, for example Xe gas, Li vapor or Sn vapor in which the very hot plasma 1210 is created to emit radiation in the EUV range of the electromagnetic spectrum. The very hot plasma 1210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 1210 is passed from a source chamber 1211 into a collector chamber 1212 via an optional gas barrier or contaminant trap 1230 (in some cases also referred to as contaminant barrier or foil trap) which is positioned in or behind an opening in source chamber 1211. The contaminant trap 1230 may include a channel structure. Contamination trap 1230 may also include a gas barrier or a combination of a gas barrier and a channel structure. The contaminant trap or contaminant barrier 1230 further indicated herein at least includes a channel structure, as known in the art.

The collector chamber 1212 may include a radiation collector CO which may be a so-called grazing incidence collector. Radiation collector CO has an upstream radiation collector side 1251 and a downstream radiation collector side 1252. Radiation that traverses collector CO can be reflected off a grating spectral filter 1240 to be focused in a virtual source point IF. The virtual source point IF is commonly referred to as the intermediate focus, and the source collector apparatus is arranged such that the intermediate focus IF is located at or near an opening 1221 in the enclosing structure 1220. The virtual source point IF is an image of the radiation emitting plasma 1210.

Subsequently the radiation traverses the illumination system IL, which may include a facetted field mirror device 1022 and a facetted pupil mirror device 1024 arranged to provide a desired angular distribution of the radiation beam 1021, at the patterning device MA, as well as a desired uniformity of radiation intensity at the patterning device MA. Upon reflection of the beam of radiation 1021 at the patterning device MA, held by the support structure MT, a patterned beam 1026 is formed and the patterned beam 1026 is imaged by the projection system PS via reflective elements 1028, 1030 onto a substrate W held by the wafer stage or substrate table WT.

More elements than shown may generally be present in illumination optics unit IL and projection system PS. The grating spectral filter 1240 may optionally be present, depending upon the type of lithographic apparatus. Further, there may be more mirrors present than those shown in the Figures, for example there may be 1-6 additional reflective elements present in the projection system PS than shown in FIG. 30.

Collector optic CO, as illustrated in FIG. 30, is depicted as a nested collector with grazing incidence reflectors 1253, 1254 and 1255, just as an example of a collector (or collector mirror). The grazing incidence reflectors 1253, 1254 and 1255 are disposed axially symmetric around an optical axis O and a collector optic CO of this type is preferably used in combination with a discharge produced plasma source, often called a DPP source.

Figure 31:
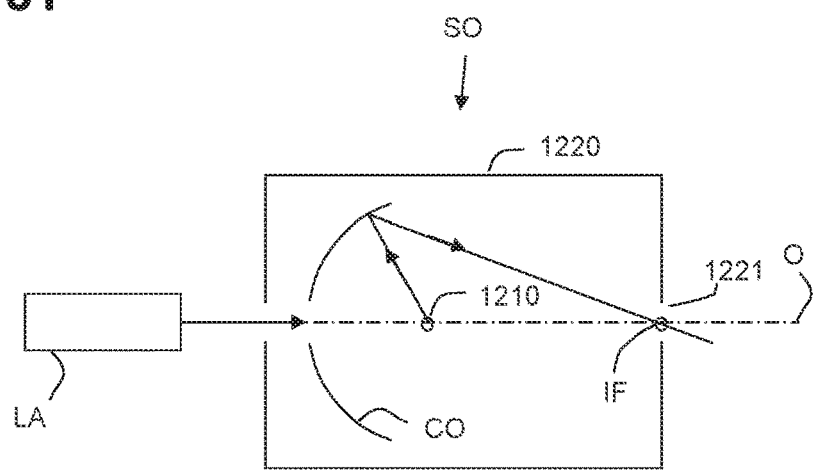
FIG. 31 is a more detailed view of a source collector apparatus of the apparatus of FIGS. 29 and 30.

In an embodiment, the source collector apparatus SO may be part of an LPP radiation system as shown in FIG. 31. A laser LA is arranged to deposit laser energy into a fuel, such as xenon (Xe), tin (Sn) or lithium (Li), creating the highly ionized plasma 1210 with electron temperatures of several 10's of eV. The energetic radiation generated during de-excitation and recombination of these ions is emitted from the plasma, collected by a near normal incidence collector optic CO and focused onto the opening 1221 in the enclosing structure 1220.

The depicted apparatuses could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid for example an immersion lithographic apparatus, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Anther arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Four different types of localized liquid supply systems are illustrated in FIGS. 2-5. Any of the liquid supply devices of FIGS. 2-5 may be used in an unconfined system; however, sealing features are not present, are not activated, are not as efficient as normal or are otherwise ineffective to seal liquid to only the localized area.

Figure 2:
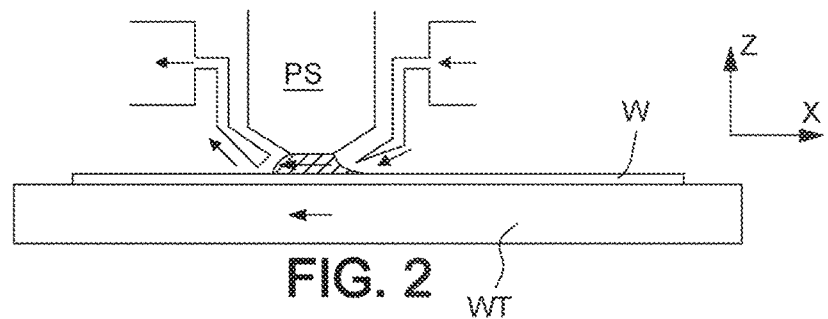
FIGS. 2 and 3 depict a liquid supply system for use in a lithographic projection apparatus.
Figure 3:
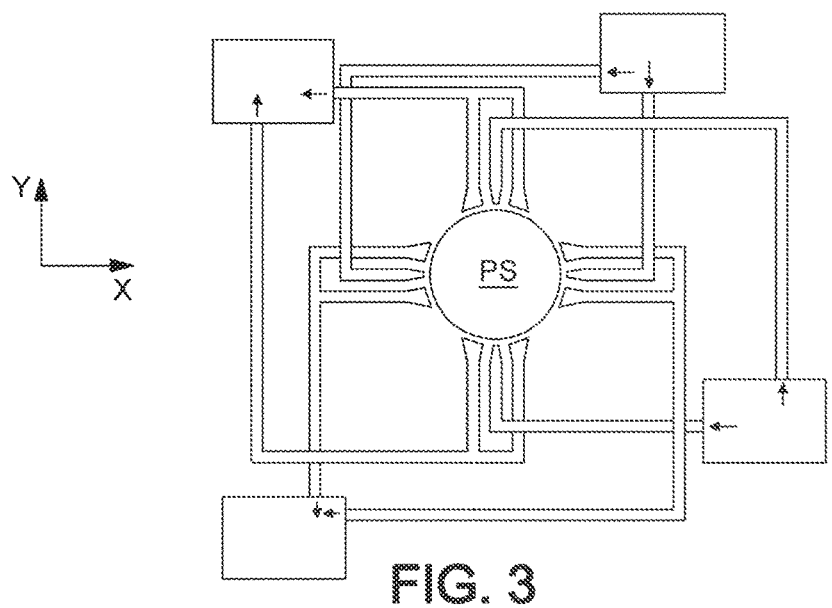

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
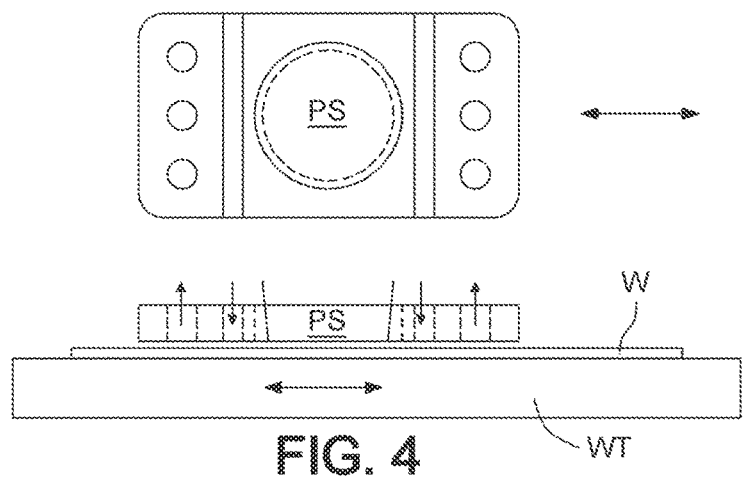
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Figure 5:
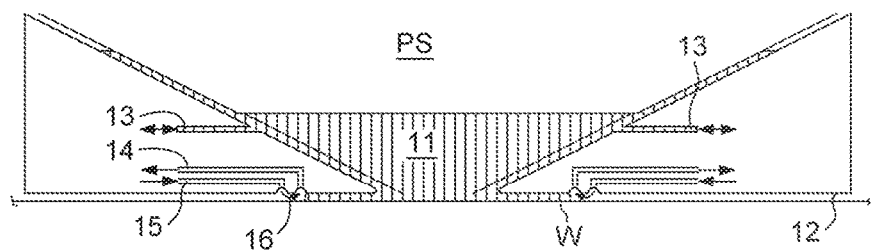
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060, and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046) in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
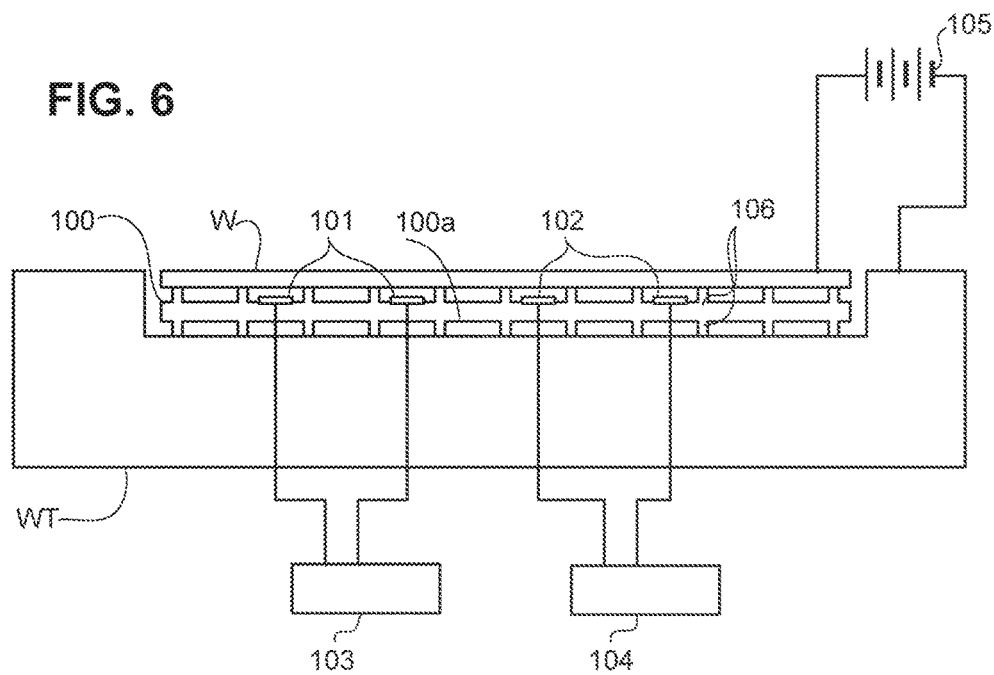
FIG. 6 depicts in cross-section a substrate table and a substrate holder according to an embodiment of the invention.

FIG. 6 depicts a substrate holder 100 according to an embodiment of the invention. It is held within a recess in substrate table WT and supports substrate W. The main body of the substrate holder 100a is substantially flat and substantially corresponding in shape and size to the substrate W, e.g., a disc. At least on a top side, in an embodiment on both sides, the substrate holder has projections 106, commonly referred to as burls. In an embodiment, the substrate holder is an integral part of the substrate table and does not have burls on the lower surface. The burls are not shown to scale in FIG. 6 (or the other Figures). In a practical embodiment, there can be many hundreds to many thousands of burls distributed across a substrate holder of diameter, e.g., 200 mm, 300 mm or 450 mm. The tips of the burls have a small area, e.g. less than 1 mm$^2$, so that the total area of all of the burls on one side of the substrate holder 100 is less than about 10% of the total area of the total surface area of the substrate holder. In this way, there is a very high probability that any particle that might lie on the surface of the substrate, substrate holder or substrate table will fall between burls and will not therefore result in a deformation of the substrate or substrate holder. The arrangement of burls can be regular or can vary as desired to provide appropriate distribution of force on the substrate and substrate table. The burls can have any shape in plan but are commonly circular in plan. The burls can have the same shape and dimensions throughout their height but are commonly tapered. The burls can project a distance of from about 1 µm to about 5 mm, desirably from about 5 µm to about 250 µm, from the rest of the surface of the main body of the substrate holder 100a. The thickness of the main body 100a of the substrate holder 100 can be in the range of about 1 mm to about 50 mm, desirably in the range of about 5 mm to 20 mm In an embodiment of the invention, the substrate holder 100 is made of rigid material. Desirably the material has a high thermal conductivity or a low coefficient of thermal expansion. A suitable material includes SiC (silicon carbide), SiSiC (siliconised silicon carbide), $Si_3N_4$ (silicon nitride), quartz, and/or various other ceramic and glass-ceramics, such as Zerodur™ glass ceramic. The substrate holder 100 can be manufactured by selectively removing material from a solid disc of the relevant material so as to leave the projecting burls. A suitable technique to remove material includes electrical discharge machining (EDM), etching, machining and/or laser ablation. Some of these techniques leave a rough surface, e.g. having a roughness value Ra of the order of several microns. The minimum roughness achievable with these removal techniques may derive from the material properties and burl manufacturing process. For example, in the case of a two-phase material such as SiSiC, the minimum roughness achievable is determined by the grain size of the two-phase material. The substrate holder can also be manufactured by growing burls through a mask. The burls are of the same material as the base or another suitable material and can be grown by a physical vapor deposition process or sputtering.

Such residual roughness causes difficulty in forming one or more electrical components, such as one or more thin film components, on the surface of the substrate and unreliability in such components. These problems may arise because the roughness causes gaps and cracks in thin layers coated or grown on the substrate holder to form an electronic component. A thin film component may have a layer thickness in the range of from about 2 nm to about 100 µm and may be formed by a process including chemical vapor deposition, physical vapor deposition (e.g. sputtering), dip coating, spin coating and/or spray coating. In an embodiment, a component formed on the substrate holder comprises a thin film stack, i.e. including a plurality of thin film layers. Such components are described further below.

An electronic component to be formed on the substrate table can include, for example, an electrode, a resistive heater and/or a sensor, such as a strain sensor, a magnetic sensor, a pressure sensor, a capacitive sensor or a temperature sensor. A heater and temperature sensor can be used to locally control and/or monitor the temperature of the substrate holder and/or substrate so as to reduce undesired or induced desired temperature variation and stress in the substrate holder or substrate. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g. water) on the substrate may cause localized cooling and hence shrinkage of the substrate. Conversely, the energy delivered to the substrate by the projection beam during exposure can cause significant heating and therefore expansion of the substrate.

In an embodiment, the component to be formed is an electrode for an electrostatic clamp. In electrostatic clamping, a potential difference is established between the substrate, or an electrode plated on its lower surface, and an electrode provided on the substrate table and/or substrate holder. The two electrodes behave as a large capacitor and substantial clamping forces can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate separately clamped to the substrate holder.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Arrangements using one or more heaters and temperature sensors to locally control the temperature of a substrate are described in co-pending U.S. patent application publication no. US 2011/0222033, which document is incorporated herein by reference in its entirety. The arrangements described therein can be modified to make use of a resistive heater and/or temperature sensor as described herein. Voltage source 105 generates a potential difference e.g. of the order of 10 to 10,000 volts, between the substrate W and substrate holder and between the substrate table WT and substrate holder and substrate table WT so that an electrostatic force clamps the substrate W, substrate holder 100 and substrate table WT together. In an embodiment, the potential difference is provided between an electrode on the lower surface of the substrate W and an electrode on the bottom of the recess in the substrate table WT.

Figure 7:
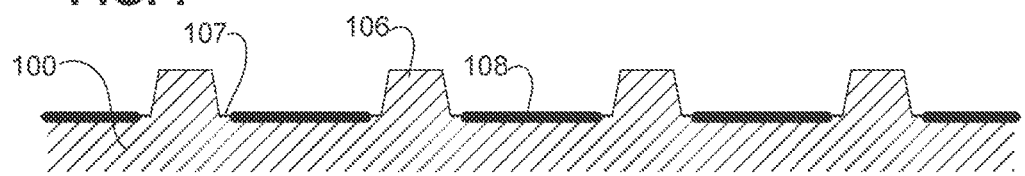
FIG. 7 is an enlarged view of a part of the substrate holder of FIG. 6.
Figure 8:
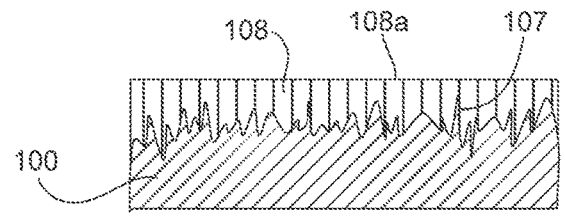
FIG. 8 is a further enlarged view of a part of the substrate holder of FIGS. 6 and 7.

FIG. 7 is an enlargement of part of the substrate holder 100 of FIG. 6 showing the upper surface 107 and some burls 106 in cross-section. In an embodiment of the invention, a planarization layer 108 is provided on the upper surface 107 in at least some areas between the burls 106. In an embodiment the planarization layer 108 is formed in a single layer. In an embodiment, the planarization layer 108 can be provided only where an electronic component is to be formed or across substantially the entire upper surface of the substrate holder 100. FIG. 8 shows a further enlargement of the planarization layer 108. As can be seen, the planarization layer 108 fills in roughnesses of the upper surface 107 and provides an upper surface 108a that is substantially smoother than the surface 107. In an embodiment of the invention the roughness Ra of the surface 108a is less than about 1.5 μm, desirably less than about 1 μm, or desirably less than about 0.5 μm. In an embodiment, the planarization layer 108 is formed by applying a plurality, e.g. two, layers of coating material or precursor material. Depending upon the material of the planarization layer 108 it can be possible to determine from inspection of the formed coating that it has been applied by forming multiple sub-layers. In an embodiment, the multiple sub-layers of the planarization layer 108 are formed of the same material. In an embodiment, the multiple sub-layers of the planarization layer 108 are formed of different materials. Suitable materials are discussed below.

In an embodiment, the planarization layer 108 is formed of a silicon oxide or silicon nitride-based compound with a functional group attached to each Si atom. The functional groups can be selected from the group consisting of hydrogen, methyl, fluoro, vinyl and the like. In an embodiment, the planarization layer 108 is formed of $Si(CH_3)_2O_x$. In an embodiment the planarization layer 108 is formed of $SiO_x$, e.g. $SiO_2$. In an embodiment the planarization layer 108 is formed of benzocyclobutene (BCB). In an embodiment the planarization layer 108 is formed of a polyimide coating material. A method of applying such a material is described in U.S. Pat. No. 7,524,735, which document is incorporated herein in its entirety by reference. In an embodiment the planarization layer 108 is formed of polymer chains consisting of $Si(CH_3)_2N$ and $Si(CH_3)_2O$ backbones.

The planarization layer 108 may have a thickness in the range of from about 0.2 μm to about 200 μm, desirably from about 2 μm to about 30 μm determined on a reference flat wafer. The planarization layer 108 is desirably sufficiently thick to fill-in most or all of the roughnesses of the surface of the substrate holder. If the planarization layer 108 is too thick, it is more likely to crack during curing. Applying the planarization layer 108 in a plurality of separate coats, as described below, can reduce the chance of such cracking and reduce the surface roughness of the final layer.

Figure 19:
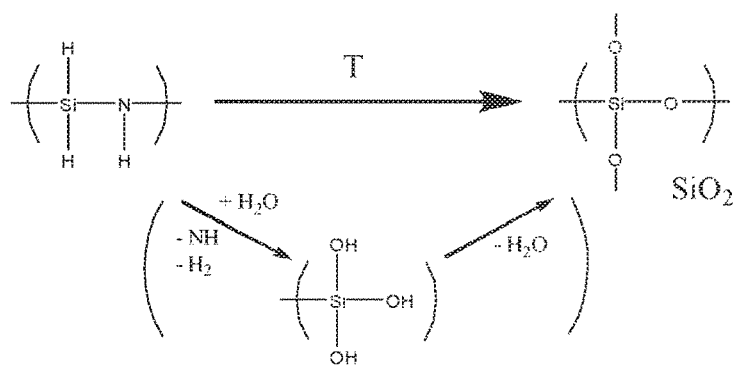
FIGS. 19 to 22 depict chemical reactions in formation of a planarization layer in an embodiment of the invention.
Figure 19:
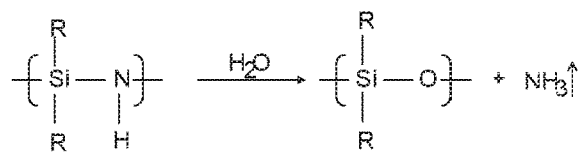
Figure 20:
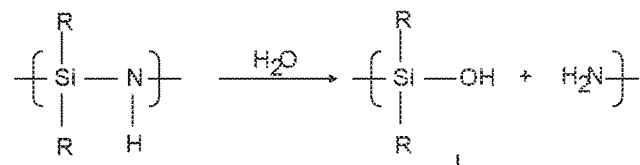
Figure 21:
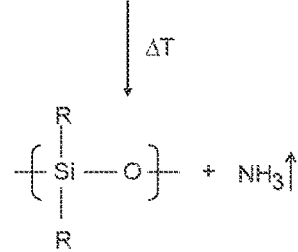
Figure 21:
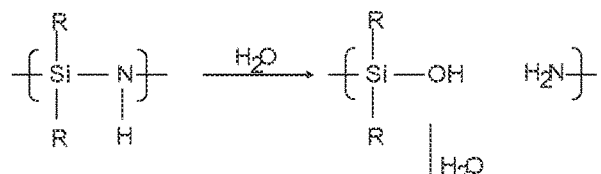
Figure 22:
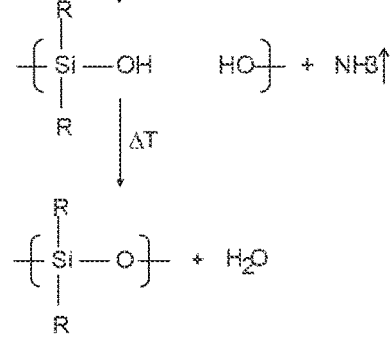

In an embodiment, the planarization layer 108 is applied by coating the substrate holder 100 with a polysilazane solution which is then cured to form the silicon-based planarization layer. The reaction involved is shown in FIG. 19. In an embodiment, the polysilazane solution is applied by a spray technique. Additionally or alternatively, other techniques such as deep coating and spin coating can be used. FIGS. 20 to 22 depict other reactions that can be used to form a planarization layer in an embodiment of the invention. FIG. 20 depicts a reaction that proceeds via an aqueous medium alone. FIG. 21 depicts a reaction that proceeds in an aqueous medium in the presence of heat. FIG. 22 depicts another reaction that proceeds in an aqueous medium in the presence of heat. In each of FIGS. 20 to 22, R depicts a functional group selected from the group consisting of hydrogen, methyl, fluoro. In an embodiment the planarization layer 108 comprises a mixture of —Si—N— backbones from the reactant polysilazene and —Si—O— backbones from the depicted reactions.

In some circumstances, a planarization layer applied as described above may not provide a surface that is sufficiently smooth for reliable formation of metal or other layers to form a thin film component. Although the planarization layer described above provides improved and sufficient Ra values, if the underlying surface has high peak to valley distances, it is likely that high peak to valley distances will be present in the surface of the planarization layer. The contour of the underlying surface can be copied to the upper surface of the planarization layer. The amplitude of peaks and valleys can be reduced but not eliminated. A machined, uncoated SiSiC substrate often has sharp peaks of height of 40 μm or more and widths of less than 5 μm. One or more of these sharp peaks penetrate through an underlying dielectric layer and conductive metal layer causing an 'electrical short'. Apart from these peaks, there are variations in overall flatness because of the surface machining process causing a contour of the SiSiC surface with a peak to valley distance of up to 100 μm. Such a peak-valley profile might not cause a pin-hole in an overlaying conductive metal and electric layer but this profile might induce a variation in the gas gap between the top of the thin layer stack to the substrate for an immersion machine and a variation in the vacuum-gap between the top of the thin layer stack to the substrate for an EUV machine. A maximum peak to valley distance of <=10 μm is desirable. A peak to valley distance of <=0.5 μm is desirable.

Figure 9:
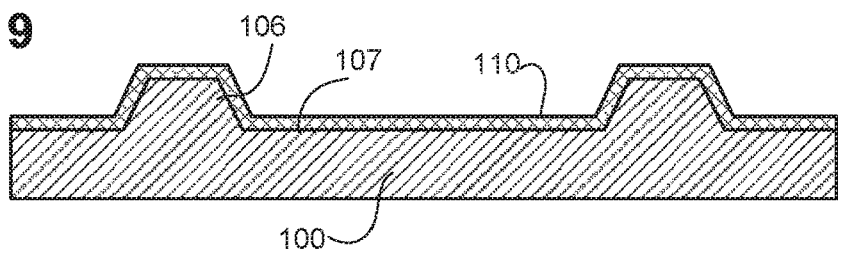
FIGS. 9 to 14 depict steps in a method of manufacturing a substrate holder according to an embodiment of the invention.
Figure 10:
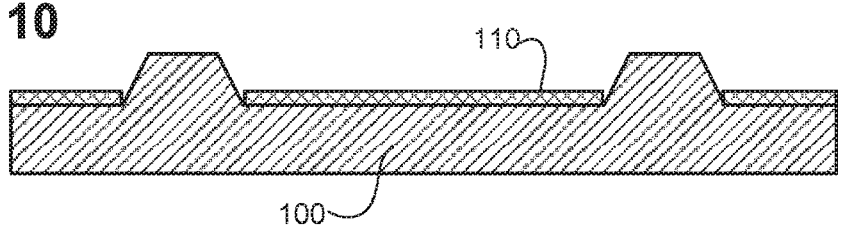
Figure 11:
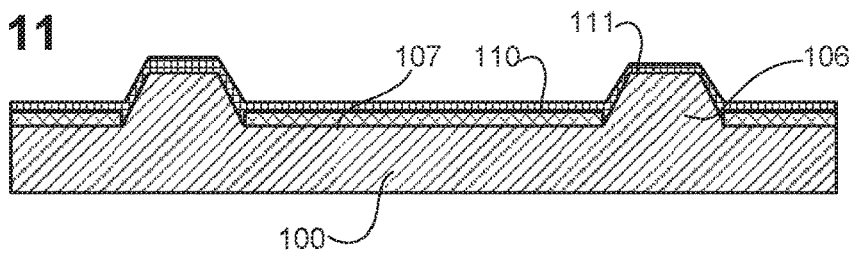
Figure 12:
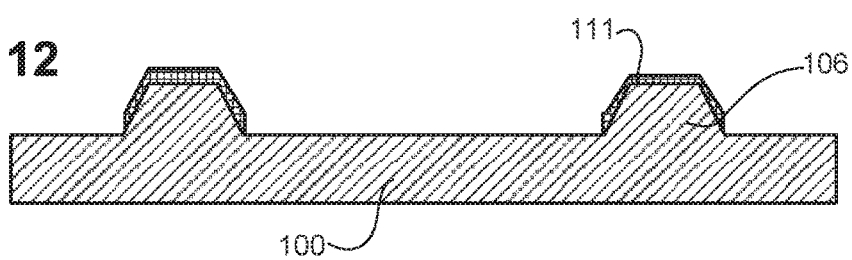
Figure 13:
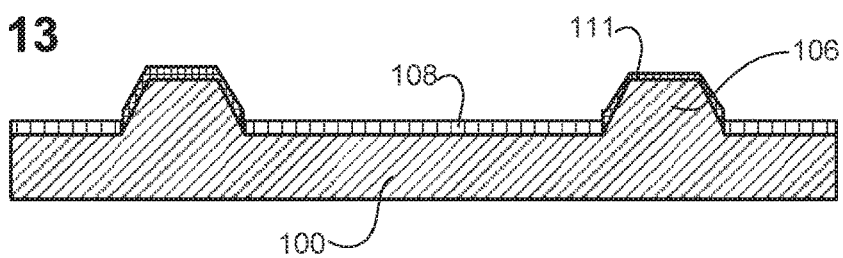

Therefore, an improved method of applying a planarization layer that reduces a peak to valley distance in the surface of the planarization layer is desirable. It is desirable that the material of the planarization layer not accumulate at the burl slopes or edges. In an embodiment, the planarization layer is of substantially uniform thickness. In an embodiment the thickness of an edge region of the planarization layer surrounding the burls is no greater than a medial region on which the thin film stack is formed. In an embodiment, the surface of the burls is treated to prevent accumulation thereon of material used to form the planarization layer, e.g. by application of a repellent (e.g., hydrophobic) material. FIGS. 9 to 14 illustrate steps in an embodiment of a method of applying the planarization layer 108. As shown in FIG. 9, a radiation-sensitive material 110, e.g. a resist, is applied, e.g. by spin coating, across the upper surface 107 of the substrate holder 100. The radiation sensitive material 110 is exposed selectively to radiation and developed to expose the burls 106 as shown in FIG. 10. Next, a repellent material 111 (described further below) is applied to form a continuous layer as shown in FIG. 11 and cured or dried. Then the remaining radiation-sensitive material 110 is removed along with the material 111 above it so that the burls are coated in the material 111 as shown in FIG. 12. In another embodiment, a repellent resist is applied, exposed and developed so that it remains only on the burls. Then the planarization layer is applied. In another embodiment the material 111 is applied selectively by an inkjet printer or using a hydrophobic sticker, which may form a mushroom shape on top of the burls.

Desirably, the material 111 covers at least the entirety of each burl, including the upper flat surface and any sloped portions. However, in an embodiment there may not be a well-defined edge to the slope of the burl. In an embodiment, a part of the slope of each burl is uncovered. In an embodiment, the material 111 covers a part of the area between burls, but not an area where an electric component is to be formed.

Figure 14:
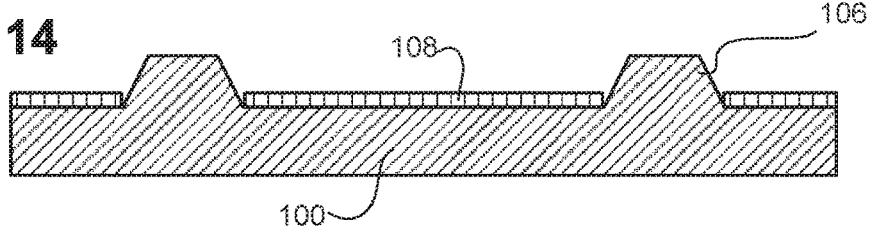

Once the material 111 is applied to the desired area, the planarization layer 108 is applied by spraying as described above. The material that forms the planarization layer preferentially accumulates in the area not coated by the material 111 so that a planarization layer 108 is formed only in the desired area. The planarization layer 108 can be applied in multiple coating steps in order to reduce the Ra surface roughness. Optionally the material 111 is removed, as shown in FIG. 14.

In an embodiment, the repellent material is a polysilazane solution (CAG 37 obtained from Clariant Advanced Materials GmbH) and the planarization material is BCB applied in an aqueous solution. Another repellent material that is usable in an embodiment is octadecyltrichlorosilane (OTS). This material forms a monolayer (a layer that is a single molecule thick) and can be deposited by chemical vapor deposition or through solution. Its molecules have two ends, one hydrophilic and one hydrophobic. The hydrophilic ends are covalently bonded to a Si or SiSiC surface and the hydrophobic organic (decyl) chain with chlorine atoms remains pointed outwards making the surface extremely hydrophobic (contact angle with water>105 degrees). Other usable repellent materials include: a methyl-terminated polymer, a siloxane (e.g. polydimethylsiloxane (PDMS)), a silazane, a fluorinated material (e.g. polytetrafluoroethylene (PTFE)), a hydrophobic monolayer material and/or a silane. A hydrophobic silane monolayer can be deposited by chemical vapor deposition with a lift-off process to remove it from selected areas. In an embodiment, the liquidphobic material has a static contact angle to the planarization material of greater than 90°.

In an embodiment, FOTS may be used as the hydrophobic material 111. FOTS is an abbreviation of fluoro-octyl-trichloro-silane (formal name (tridecafluoro-1,1,2,2-tetrahydrooctyl)trichlorosilane, formula $CF_3(CF_2)_5CH_2CH_2SiCl_3$) which forms a self-assembled monolayer having a contact angle to water of up to or even greater than 110°. Other flourinated silanes are also usable in an embodiment of the invention.

In an example test, to apply FOTS to burls on a test substrate holder of SiSiC, the test substrate holder is first cleaned in an $HNO_3$ bath. Then, a negative resist is applied, exposed and developed so that the burls and some test areas are free of resist and other areas are covered. An evacuated desiccator can be used to apply a FOTS monolayer by vapor deposition. The resist may be removed using an ultrasonic bath of acetone so that the FOTS monolayer covers only the burls.

Contact angles of static ultra-pure water droplets (measured by contact angle measuring instrument DSA30 by Kruss, Germany) in the test areas gave values in excess of 105°.

A 20 μm layer of BCB (as used above) was sprayed on to the test substrate holder and cured at 300° C. Inspection by confocal microscopy revealed that the burl tops remained free of the BCB layer, as desired, and the burl profile was not undesirably changed. The FOTS monolayer was removed by application of a 1% aqueous solution of HF for 3 minutes without damage to the SiSiC burls or the BCB planarization layer.

Roughness measurements taken by scanning along 10 mm lines on the planarization layer of the test substrate, gave Ra values of 0.67±0.3 μm and peak-valley distances of 3.35±0.8 μm, which is more than acceptable for the desired use.

In an embodiment, a planarization material in a non-aqueous solution or formed from a non-aqueous precursor is used and the repellent material is replaced by an attractive (e.g., hydrophilic) material. In general terms, a surface-energy modifying agent that tends to repel the solvent of the planarization material or the precursor of the planarization material is selectively applied to the substrate table. Other techniques than the photolithographic technique described above can be used to selectively apply the surface-energy modifying material. For example the surface-energy modifying material can be applied by inkjet printer or by dropper.

The mechanism by which it is presently believed an embodiment of the invention works is described below with reference to FIGS. 15 to 18. These are scanning electrode microscope (SEM) images of sample pieces of a substrate holder. A small piece of each sample was held in a circular cavity and immersed in a transparent epoxy material. The epoxy was then cured and polished until a cross-section with two complete burls is reached. A very thin carbon layer was vapor deposited on the surface to increase its conductivity. The surface was measured with a SEM at 10 keV e-beam. The magnifications of the images and scale bars are shown in each image.

Figure 15:
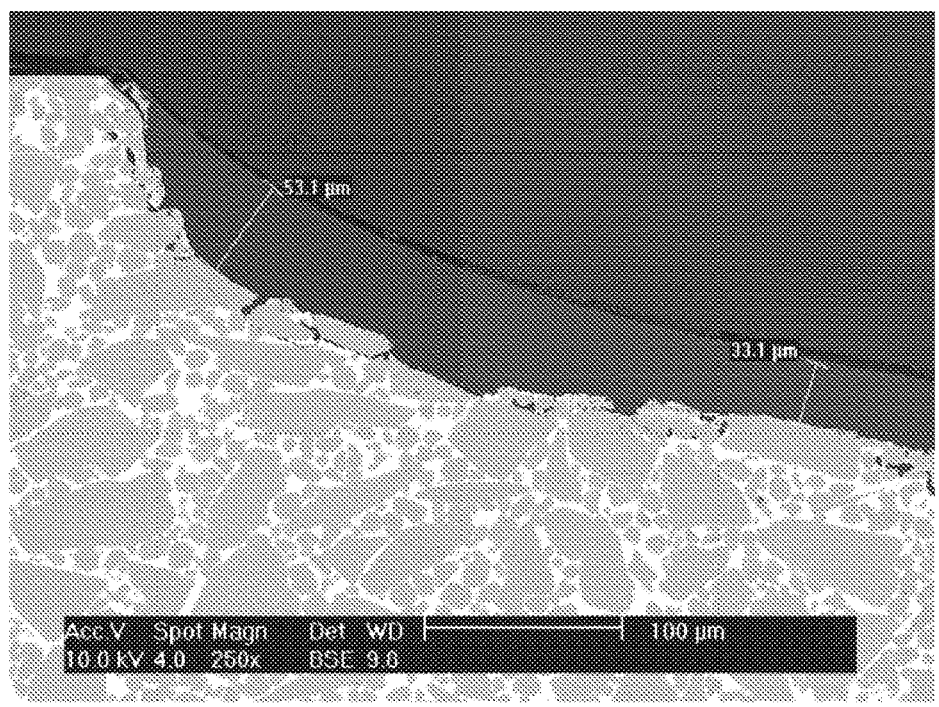
FIGS. 15 to 18 are scanning electron microscope images of planarization layers on substrate holders.
Figure 16:
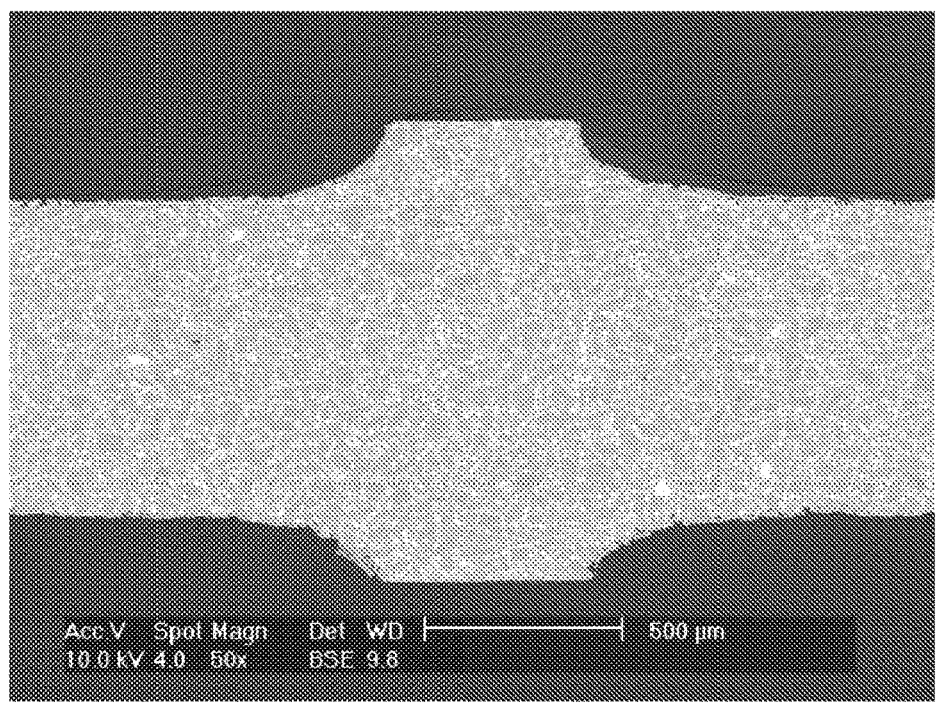

FIGS. 15 and 16 show a sample of a SiSiC substrate holder on which a BCB solution was sprayed directly, without application of a hydrophobic layer. It can be seen that the outer surface of the BCB layer is concave and the layer varies in thickness. The BCB layer is thickest on the slopes of the burls and thinnest in a region away from the burls. BCB material appears to accumulate on the slopes of the burls and in the corners where the burls begin to rise out of the body of the substrate holder. It is believed that the accumulation of material shown reduces the thickness of the planarization layer in the areas away from the burls as compared to an even distribution. The reduced thickness of the planarization layer in the area where a component is to be formed allows high peak-to valley variation in the underlying surface to be copied to the outer surface of the planarization layer.

Figure 17:
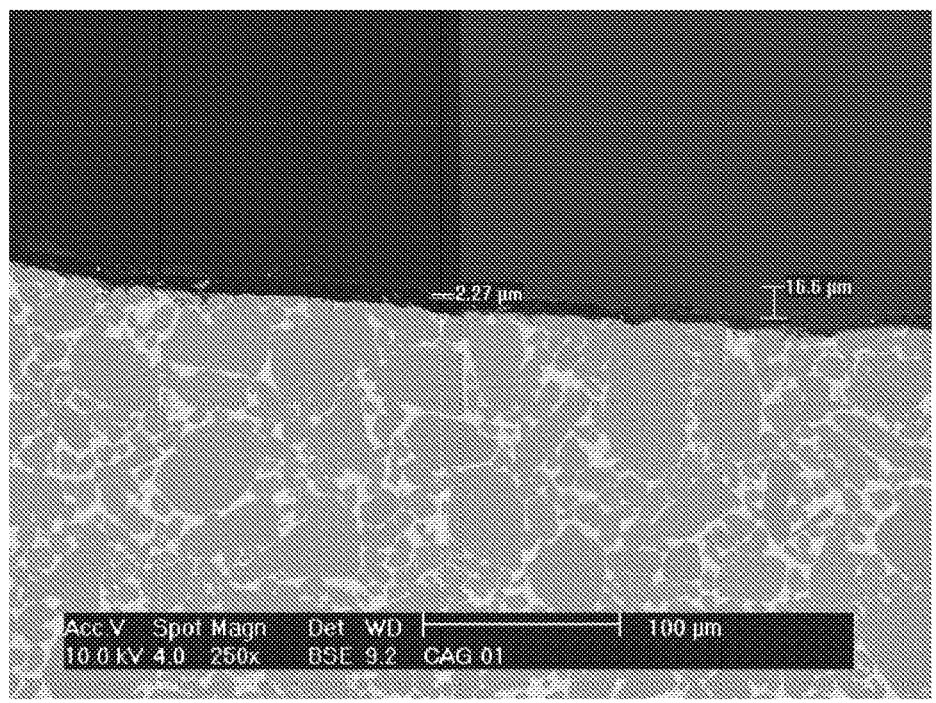
Figure 18:
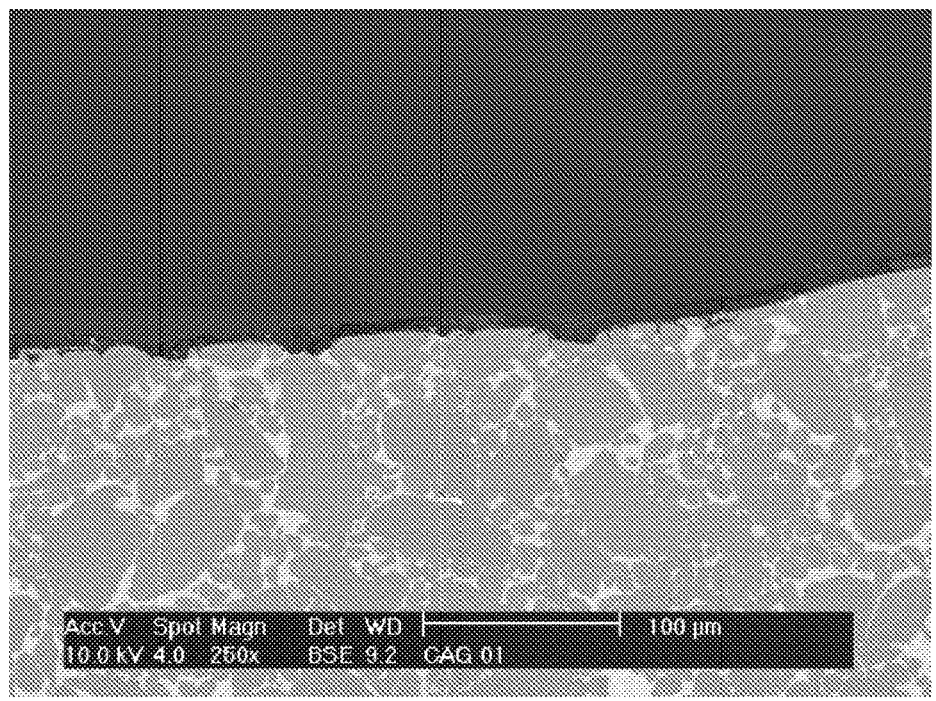

FIGS. 17 and 18 show two locations of a sample on which a planarization layer was applied using a method according an embodiment of the invention. Specifically, CAG 37 was applied by dropper to the burls and BCB applied by spraying. It will be seen that the resulting surface of the planarization layer is much flatter and there is substantially no accumulation of material on the burl slopes or corners. In fact, the planarization layer is thinner at its edges than in the middle.

Roughness values measured on the samples discussed above are given in Table 1 below:

| Sample | Ra [μm] | Peak-Valley [μm] |
|---|---|---|
| Bare SiSiC | 1.8 | 23.3 |
| With CAG 37 | 0.5 | 2.96 |
| With CAG 37 | 0.89 | 5.44 |

Ra and Peak to valley values given above where obtained using a Taylor Hobson stylus profiler having a diamond tip of radius 2 μm, which is scanned over the layer to measure its profile. Ra and peak to valley distances are obtained from the contour map. Other equivalent instruments and methods can be used instead.

Figure 23:
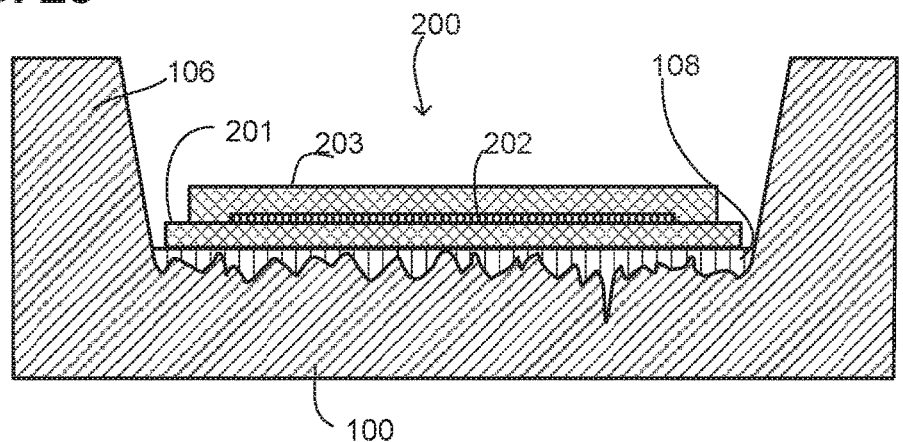
FIG. 23 depicts in cross-section a substrate holder according to an embodiment of the invention.

As shown in FIG. 23, an embodiment of the invention involves deposition of different layers forming a thin-film stack 200 on a (SiSiC) surface of a substrate holder 100 between the burls 106 in the following general order viz. 1) planarization layer 108, 2) isolation layer 201 (if necessary), 3) metal electrode lines 202 and 4) top isolation layer 203. In an embodiment of the present invention the thin layer stack 200 can be formed on a substrate holder formed of other materials (as described above) or a substrate table formed of similar materials.

The planarization layer 108 is formed as described above. The planarization layer 108 in an embodiment has a thickness greater than 10 μm measured on a reference flat substrate. Metal electrode lines 202 are patterned on the surface of the planarization layer 108. If the planarization layer 108 is sufficiently thick, it may also provide electrical isolation between the substrate holder 100 (e.g., SiSiC) and the patterned metal electrode lines 202. If desired to improve isolation, a thin layer (isolation layer) of PE CVD (Plasma Enhanced Chemical Vapor Deposition) $SiO_x$ can be deposited on top of the planarization layer to provide electrical isolation between the peaks of the substrate holder surface and metal electrode lines if necessary. The isolation layer 201 desirably has a thickness greater than 0.1 μm. Desirably it has a thickness less than 10 μm. In an embodiment the isolation layer 201 has a thickness of 5 μm.

Metal electrode lines 202 are deposited by photolithography or metal deposition and etching through a hard mask. Metal electrode lines 202 desirably have a width greater than 20 μm. The maximum width of the metal electrode lines is determined by their function and available space; it can be several 10s of millimeters. Other methods of forming the metal electrode lines are usable. In the case of a heater and/or sensor, wide metal lines (e.g. about 1500 μm) can be used as heating elements and narrow metal lines (e.g. about 100 μm) can be used as sensor elements. For an electrostatic clamp, two halves of continuous metal film (but isolated from the burl tops) separated by approximately 500 μm from each other can be deposited to form positive and negative elements of the electrostatic clamp. Metal electrode lines 202 desirably have a layer thickness greater than about 20 nm, desirably greater than about 40 nm. Metal electrode lines 202 desirably have a layer thickness less than or equal to about 1 μm, desirably less than about 500 nm, desirably less than about 200 nm.

For heater and/or sensor development, patterned metal lines may consist of Ti—Pt (10 nm thick titanium for better adhesion of approximately 250 nm thick platinum) lines with varying widths. Patterning of Ti/Pt can be achieved using a combination of photo resist deposition, PVD for metal film deposition and a lift off process. For a heater alone, wide chromium lines (~1500 μm) can be deposited by Cr film deposition (PVD) and selective Cr etching from the burl tops using a hard mask. For an electrostatic clamp, metal electrodes can consist of aluminum, or chromium or any other conductive material and can be formed by PVD or sputtering. Alloys of these metals can also be used.

It is desirable to electrically isolate deposited metal lines from above and protect them from particle depositions, scratches and oxidation. Hence a top isolation layer 203 is deposited on the patterned electrodes. For a heater or a sensor, the isolation layer can be deposited by spray coating of BCB and/or NN 120 or $SiO_x$ as described previously or a combination of sprayed layers and $SiO_x$. In the case of an electrostatic clamp, a top isolation layer 203 also provides dielectric strength so that the clamping pressure and gap between the layer stack and substrate can be tuned to desired values. In an embodiment, the top isolation layer 203 for an electrostatic clamp consists of spray coated polymer layers of BCB, NN 120 (or combination of these two sprayed materials) or $SiO_x$ alone or a combination of sprayed polymers layers and $SiO_x$, or parylene (CVD) alone. The top isolation layer 203 desirably has a layer thickness greater than about 0.1 μm, desirably greater than about 1 μm. Top isolation layer 203 desirably has a layer thickness less than about 10 μm, desirably less than about 3 μm, for a heater or sensor. For an electrostatic clamp, top isolation layer desirably has a layer thickness less than about 100 μm, desirably less than about 20 μm. In an embodiment the thickness is in a range from about 10 to about 60 μm.

Table 2 below shows examples of suitable materials per layer in order to build a thin film stack. Each layer may be formed of one of the listed materials or a combination of two or more materials.

| Appl. Layer | 1. Heater only | 2. Sensor & Heater | 3. Clamp |
|---|---|---|---|
| Bottom isolation | BCB spray<br>CAG 37 spray<br>NN 120 spray<br>$SiO_x$<br>PVD/CVD/<br>PECVD/<br>Sputtering<br>Polyimide Spray | BCB spray<br>CAG 37 spray<br>NN 120 spray<br>$SiO_x$<br>PVD/CVD/PECVD/<br>Sputtering<br>Polyimide Spray | BCB spray<br>CAG 37 spray<br>NN 120 spray<br>$SiO_x$<br>PVD/CVD/PECVD/<br>Sputtering<br>Parylene CVD<br>Polyimide Spray |
| Metal layer | Chrome<br>PVD/CVD/<br>Sputtering | Platinum<br>PVD/CVD/<br>Sputtering<br>lift-off | Chrome,<br>Aluminum<br>PVD/CVD/<br>Sputtering |

-continued

| Appl. Layer | 1. Heater only | 2. Sensor & Heater | 3. Clamp |
|---|---|---|---|
| Top isolation | BCB spray<br>CAG 37 spray<br>NN 120 spray<br>$SiO_x$<br>PVD/CVD/PECVD/<br>Sputtering<br>Polyimide Spray | BCB spray<br>CAG 37 spray<br>NN 120 spray<br>$SiO_x$<br>PVD/CVD/PECVD/<br>Sputtering<br>Polyimide Spray | BCB spray<br>CAG 37 spray<br>NN 120 spray<br>$SiO_x$<br>PVD/CVD/PECVD/<br>Sputtering<br>Parylene CVD<br>Polyimide Spray |

Table 3 below shows examples of specific function and requirements per layer for the applications

| Appl. Layer | 1. Heater only | 2. Sensor & Heater | 3. Clamp |
|---|---|---|---|
| Planarization | reduce roughness | reduce roughness | reduce roughness<br>improve flatness<br>(pressure uniformity) |
| Bottom isolation | moderate electrical isolation<br>low temperature difference across the layer<br>short response time | high electrical isolation (for sensor resolution)<br>low temperature difference across the layer<br>short response time | high dielectric strength<br>high volume resistivity<br>low temperature difference across the layer |
| Metal layer | heater power | sensor sensitivity<br>sensor stability<br>heater power | high voltage requirements<br>(electrode layout) |
| Top isolation | encapsulation | encapsulation | high dielectric strength<br>high volume resistivity<br>low temperature difference across the layer |

Thin film technology offers an overlay improvement and a cost effective solution for heater and/or sensor development. Metal pattern designs can be modified easily (by modifying mask designs). In an electrostatic clamp, the layer stack may avoid critical glass bonding steps used in the current substrate clamp manufacturing process. Because the clamp can be built up in between the burls it is possible to have SiSiC burls. This is beneficial for wear. If a platinum (Pt) metal layer is used, a titanium adherence layer can first be applied to improve adhesion of the Pt layer. For an electrostatic clamp, any suitable metal having a low resistance can be used.

Dielectric layers can be deposited by spray coating, spin coating and PE CVD techniques. Spray coating is particularly suitable for depositing a polymer based layer (dissolved in organic solvent) such as a BCB and/or NN 120 layer. Sprayed layers may suffer from surface defects such as pin-holes (because of local impurities) and cracks (most likely because of stresses induced in the layers) if too thick layers are deposited. It is possible to reduce the effect of these surface imperfections by combining different deposition processes. In an embodiment of the invention, layers can be applied using an inkjet or bubble-jet printing technique. This allows for local control of the layer thickness, which can be useful to correct for local variation in the surface contour or the surface roughness of the substrate holder. These techniques also enable patterning of a conductive layer using a conductive ink. A combination of different materials and/or layer formation techniques can be desirable as a defect in one layer can be cured by another layer.

Figure 24:
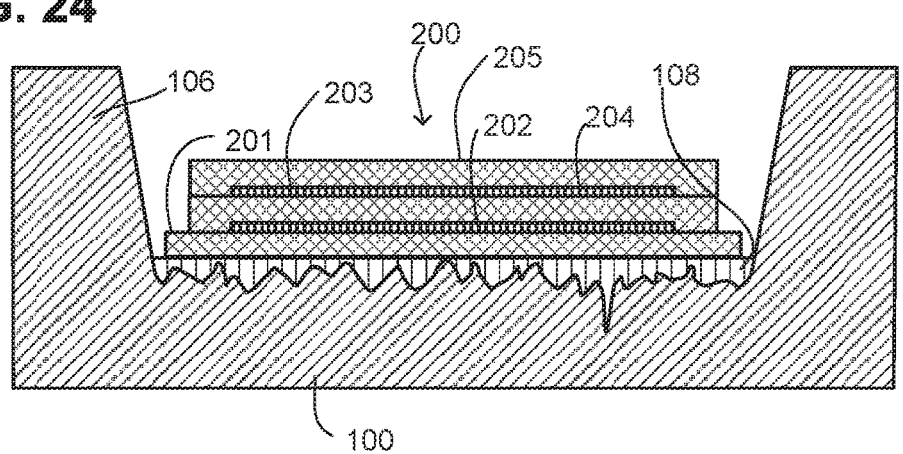
FIG. 24 depicts in cross-section a substrate holder according to an embodiment of the invention.

An embodiment of the invention is shown in FIG. 24 which is a cross-section of part of a substrate holder 100. This embodiment has a planarization layer 108 which can be formed by any of the above-described methods. Above planarization layer 108 is formed a thin film stack 200 comprising, in order above the planarization layer 108, first isolation layer 201, a first metal layer (e.g., metal electrode line) 202, second isolation layer 203, a second metal layer (e.g., metal electrode line) 204 and third isolation layer 205. Each of these layers can be formed by a suitable method as described above. Further metal layers and further isolation layers can also be provided. In this embodiment, the use of two or more stacked metal layers allows the formation of two or more stacked components, e.g. sensors. Stacked sensors can provide increased isolation from noise. In an embodiment, one or more metal layers can act as shielding for one or more signal lines in other layers.

Figure 25:
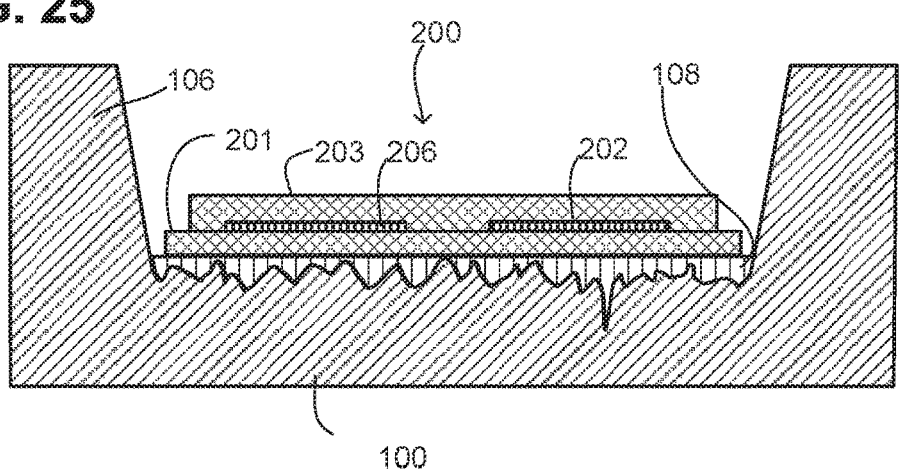
FIG. 25 depicts in cross-section a substrate holder according to an embodiment of the invention.

An embodiment of the invention is shown in FIG. 25 which is a cross-section of part of a substrate holder 100. This embodiment has a planarization layer 108 which can be formed by any of the above-described methods. Thin film stack 200 comprises first isolation layer 201 and second isolation layer 203 sandwiching between them electronic components 202, 206. In this way, multiple components can be formed in a single layer on the substrate. In an embodiment, each of the components 202, 206 is formed by a plurality of layers, for example of metal-amorphous silicon-metal. In such an embodiment, one or more of the components 202, 206 form a transistor or other logic device. Such logic devices can be used to control an array of heaters disposed across the surface of the substrate holder 100 without requiring individual connections to each heater. The transistors can be arranged at the intersection of word and bit lines and each connected to an associated heater to form an active matrix.

Figure 26:
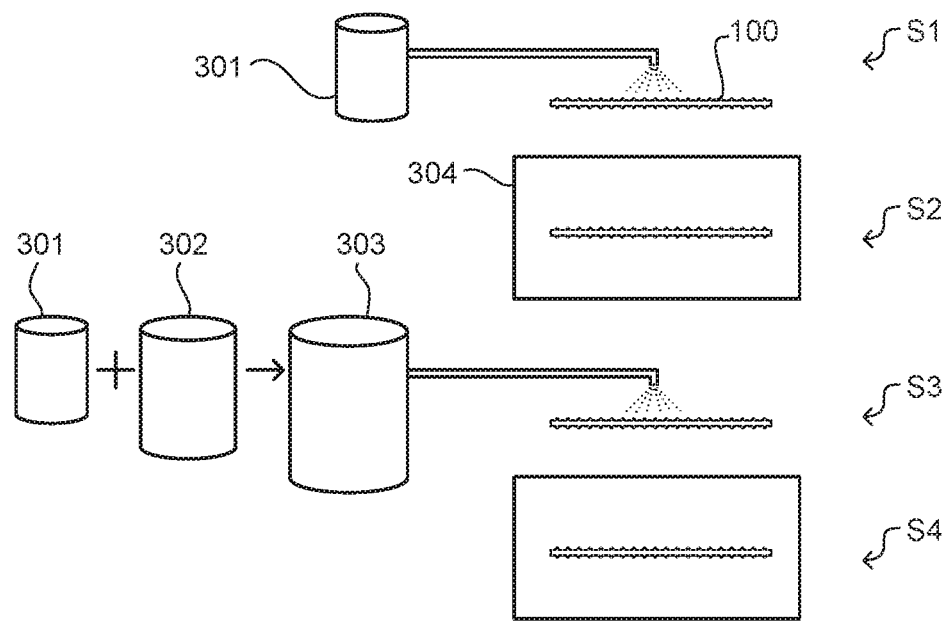
FIG. 26 depicts steps in a method of manufacturing a substrate holder according to an embodiment of the invention.

In another aspect, a further solution to the problem of accumulation of material on the slopes of burls is provided. In this aspect two layers of planarization material are applied by spraying solutions. The solutions used to apply the two layers have different concentrations. The method is shown in FIG. 26.

In a first step, S1 a first solution 301 of planarization material is applied, e.g. by spraying, to substrate holder 100 in a controlled amount to achieve a first sub-layer of a desired film thickness, e.g. 20 μm. In an embodiment, the first solution is a solution of BCB in the form received from the supplier (e.g., CYCLOTENE* 3022-46 Advanced Electronics Resin supplied by The Dow Chemical Company). The first sprayed layer is then cured S2, for example at a temperature of 200° C. for 40 mins to 1 hour. The cured layer can be activated to improve adhesion of the next layer.

In step S3 a second solution 303 of planarization material is applied, e.g. by spraying to substrate holder 100 in a controlled amount to achieve a desired film thickness, e.g. 5 μm. In applying the second sub-layer, a different concentration of the planarization material is used. In an embodiment, the solution 301 is diluted by mixing with mesitylene solvent 302 obtained from, e.g., Sigma-Aldrich Chemi B.V. of the Netherlands. This solvent consists mainly of 1,3,5-trimethal benzene ($C_9H_{12}$) and another equivalent can be used in its place. After application of the second sub-layer, the substrate holder is cured S4, for example at a temperature of about 250° C. or 300° C. for 1 hour.

The application of the original concentration and diluted solutions can be performed in either order, i.e., the first sub-layer S1 may be applied using a diluted solution and the second sub-layer may be applied S3 using the original concentration solution. In an embodiment, the amount of diluting solvent 302 is less than about three times the weight of the original planarization material solution so that the concentration of the solution applied to the substrate is greater than about 25%, compared to 100% concentration for the original solution. In an embodiment, the amount of diluting solvent is about 1.5 times the amount of the original solution by weight leading to a concentration of about 40%. In an embodiment the amount of diluting solution is about 50% by weight of the original solution 301 leading to a concentration of about 66%. In an embodiment the amount of diluting solvent is greater than about 25% by weight of the original solution 301 leading to a concentration of less than about 80% by weight.

Figure 27:
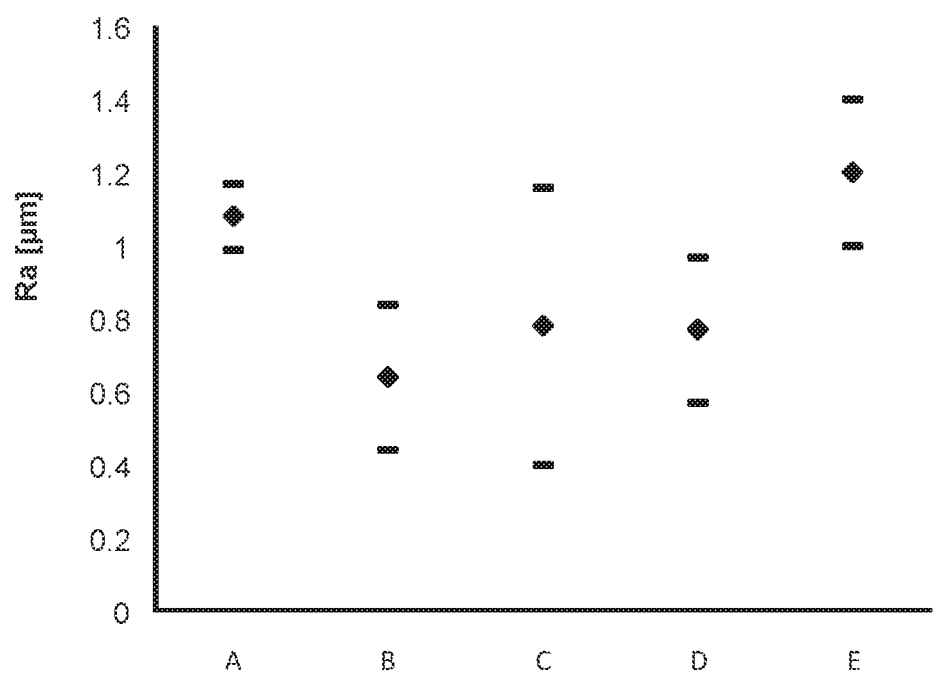
FIG. 27 is a graph of Ra roughness values of planarization layers formed according to the method of FIG. 26 and a comparative example.
Figure 28:
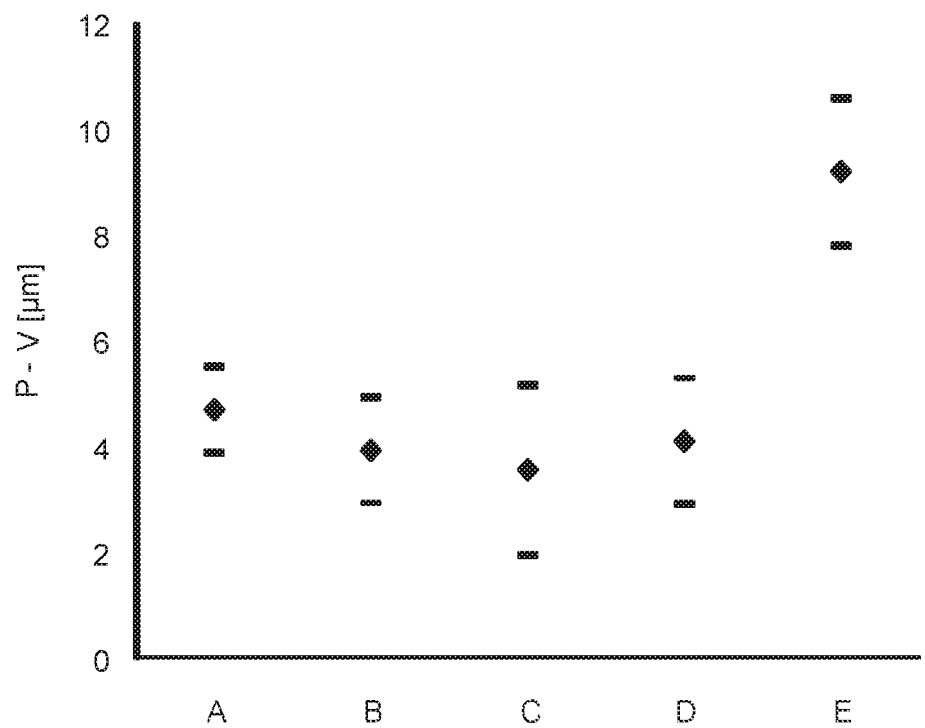
FIG. 28 is a graph of peak-valley roughness values of planarization layers formed according to the method of FIG. 26 and a comparative example.

Table 4 below shows results of experiments to demonstrate the effect of this embodiment. These results are also plotted in FIGS. 27 (Ra) and 28 (peak to valley). Substrates A to D were coated using two layers of BCB applied in different dilutions as indicated in Table 4. Substrate E is a comparative example on which a single layer of BCB was applied at original concentration. It will be seen that the planarization layers of substrates A to D have a comparable, or slightly improved, Ra value compared to the comparative example but also a significantly improved peak to valley distance.

| Substrate | Concentration Layer 1 | Concentration Layer 2 | Ra [μm] | Peak-valley [μm] |
|---|---|---|---|---|
| A | 40% | 100% | 1.08 ± 0.09 | 4.69 ± 0.8 |
| B | 100% | 40% | 0.64 ± 0.2 | 3.93 ± 0.99 |
| C | 66% | 100% | 0.78 ± 0.38 | 3.56 ± 1.61 |
| D | 100% | 66% | 0.77 ± 0.2 | 4.1 ± 1.19 |
| E |  | 20 mμ BCB (100%) | 1.2 ± 0.2 | 9.2 ± 1.4 |

In an embodiment, there is provided a substrate holder for use in a lithographic apparatus, the substrate holder comprising: a main body having a surface; a plurality of burls projecting from the surface and having end surfaces to support a substrate; a planarization layer provided on at least part of the main body surface; and a thin film stack provided on the planarization layer and forming an electric component, wherein the planarization layer has an outer surface having a peak to valley distance of less than about 10 μm.

In an embodiment, the burls have an outer surface that has been treated to repel a solvent or precursor of the planarization layer. In an embodiment, the outer surface of the burls is treated by application of a repellent substance. In an embodiment, the repellent substance is one or more selected from the group consisting of: polysilazane solution; octadecyltrichlorosilane; a methyl-terminated polymer; a siloxane; a silazane; a fluorinated material; a hydrophobic monolayer material; a silane, a flourinated silane and fluoro-octyl-trichloro-silane. In an embodiment, the planarization layer comprises a first sub-layer formed on the main body and a second sub-layer formed on the first sub-layer that have been applied by applying first and second solutions of a solvate in a solvent respectively, the first solution having a first concentration of the solvate and the second solution having a second concentration of the solvate, the first and second concentrations being different. In an embodiment, the first concentration is higher than the second concentration. In an embodiment, the second concentration is higher than the first concentration. In an embodiment, the planarization layer is formed of a material or a combination of materials selected from the group consisting of: benzocyclobutene; perhydropolysilazene, SiO2, parylene and/or polyimide. In an embodiment, the electronic component is a component selected from the group consisting of: an electrode, a heater, a sensor a transistor and a logic device. In an embodiment, the electrode is, in use, an electrode of an electrostatic clamp.

In an embodiment, there is provided a lithographic apparatus, comprising: a support structure configured to support a patterning device; a projection system arranged to project a beam patterned by the patterning device onto a substrate; and a substrate holder arranged to hold the substrate, the substrate holder being according to any of the preceding claims.

In an embodiment, the lithographic apparatus further comprises a substrate table and wherein the substrate holder is integrated into the substrate table.

In an embodiment, there is provided a device manufacturing method using a lithographic apparatus, the method comprising: projecting a beam patterned by a patterning device onto a substrate while holding the substrate in a substrate holder, wherein the substrate holder comprises: a main body having a surface; a plurality of burls projecting from the surface and having end surfaces to support a substrate; a planarization layer provided on at least part of the main body surface; and a thin film stack provided on the planarization layer and forming an electric component, the planarization layer having an outer surface having a peak to valley distance of less than about 10 μm.

In an embodiment, there is provided a method of manufacturing a substrate holder for use in a lithographic apparatus, the method comprising: providing a main body having a surface and a plurality of burls projecting from the surface and having end surfaces to support a substrate; forming a planarization layer on at least part of the main body surface; and forming a thin film stack on the planarization layer, the thin film stack forming an electric component and the planarization layer having an outer surface having a peak to valley distance of less than about 10 μm.

In an embodiment, the method further comprises selectively treating the surface of the burls to repel a solvent or a precursor of a material used to form the planarization layer before forming the planarization layer. In an embodiment, treating the surface of the burls comprises applying a repellent substance to the burls. In an embodiment, applying the repellent substance comprises: forming a mask on the substrate holder, the mask exposing burls and shielding another part of the substrate holder; and applying the repellent material to the part of the substrate holder exposed by the mask. In an embodiment, the repellent substance is one or more selected from the group consisting of: polysilazane solution; octadecyltrichlorosilane; a methyl-terminated polymer; a siloxane; a silazane; a fluorinated material; a hydrophobic monolayer material; a silane, a flourinated silane and fluoro-octyl-trichloro-silane. In an embodiment, a part of the surface of the main body underlying the thin film stack is not treated to repel a solvent or precursor. In an embodiment, forming the planarization layer comprises: spraying a first solution of a solvate in a solvent onto the substrate holder; curing the first solution to form a first sub-layer; spraying a second solution of solvate in a solvent onto the first sub-layer; and curing the second solution to form a second sub-layer, wherein the first and second solutions have different concentrations of the solvate. In an embodiment, the first solution has a higher concentration of the solvate than the second solution. In an embodiment, the first solution has a lower concentration of the solvate than the second solution. In an embodiment, the planarization layer is formed of a material or a combination of materials selected from the group consisting of: benzocyclobutene; perhydropolysilazene, SiO2, parylene and/or polyimide.

In an embodiment, there is provided a substrate holder for use in a lithographic apparatus, the substrate holder comprising: a main body having a surface; a plurality of burls projecting from the surface and having end surfaces to support a substrate; a planarization layer provided on at least part of the main body surface; and a thin film stack provided on the planarization layer and forming an electric component, the planarization layer having a substantially uniform thickness. In an embodiment, the planarization layer has an edge region surrounding burls and a medial region where the thin film stack is formed, the edge region having a thickness no greater than the medial region.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) and extreme ultraviolet (EUV) radiation (e.g. having a wavelength of or about 365, 248, 193, 157, 126, 13.5 or 6.5 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method comprising;
applying a first solution of a solvate of planarization material in a solvent onto an object holder to form a first sub-layer of a planarization layer on the object holder; and
applying a second solution of the solvate of planarization material in a solvent onto the first sub-layer to form a second sub-layer of the planarization layer,
wherein the first and second solutions have different concentrations of the solvate.

2. The method of claim 1, wherein the second solution has a concentration of a greater than or equal to about 25% where the first solution is treated as having 100% concentration or wherein the first solution has a concentration of a greater than or equal to about 25% where the second solution is treated as having 100% concentration.

3. The method of claim 1, wherein the second solution has a concentration of a greater than or equal to about 40% where the first solution is treated as having 100% concentration or wherein the first solution has a concentration of a greater than or equal to about 40% where the second solution is treated as having 100% concentration.

4. The method of claim 1, wherein the first sub-layer is thicker than the second sub-layer.

5. The method of claim 1, wherein the second solution has a higher concentration of the solvate than the first solution.

6. The method of claim 1, wherein the first and second solutions comprise one or more selected from: benzocyclobutene; perhydropolysilazene, $SiO_2$, parylene and/or polyimide.

7. The method of claim 1, wherein at least part of the object holder to which the planarization layer is provided is repellent to a material used to form the planarization layer.

8. A substrate holder system comprising:
   a main body of a substrate holder, the main body having a surface with surface roughness;
   a plurality of burls projecting from the surface and having end surfaces to support a substrate; and
   a planarization layer provided on at least part of the surface of the main body, the planarization layer comprising at least a first sub-layer and a second sub-layer, the first-sub layer formed from a solvate of planarization material in a first solution and the second-sub layer formed on the first sub-layer from the solvate of planarization material in a second solution, wherein the first and second solutions have different concentrations of the solvate.

9. The substrate holder system of claim 8, wherein the second solution has a concentration of a greater than or equal to about 25% where the first solution is treated as having 100% concentration or wherein the first solution has a concentration of a greater than or equal to about 25% where the second solution is treated as having 100% concentration.

10. The substrate holder system of claim 8, wherein the second solution has a concentration of a greater than or equal to about 40% where the first solution is treated as having 100% concentration or wherein the first solution has a concentration of a greater than or equal to about 40% where the second solution is treated as having 100% concentration.

11. The substrate holder system of claim 8, wherein the first sub-layer is thicker than the second sub-layer.

12. The substrate holder system of claim 8, wherein the second solution has a higher concentration of the solvate than the first solution.

13. The substrate holder system of claim 8, wherein the first and second solutions comprise one or more selected from: benzocyclobutene; perhydropolysilazene, $SiO_2$, parylene and/or polyimide.

14. The substrate holder system of claim 8, wherein at least part of the object holder to which the planarization layer is provided is repellent to a material used to form the planarization layer.

15. A method comprising:
   applying planarization material with a first concentration onto an object holder to form a first sub-layer of a planarization layer on the object holder;
   applying planarization material with a second concentration onto the first sub-layer to form a second sub-layer of the planarization layer; and
   forming an electric or electronic component on the planarization layer,
   wherein the first and second concentrations are different.

16. The method of claim 15, wherein the planarization material with the second concentration has a concentration of a greater than or equal to about 25% where the planarization material with the first concentration is treated as having 100% concentration or wherein the planarization material with the first concentration has a concentration of a greater than or equal to about 25% where the planarization material with the second concentration is treated as having 100% concentration.

17. The method of claim 15, wherein the first sub-layer is thicker than the second sub-layer.

18. The method of claim 15, wherein the second concentration is higher than the first concentration.

19. The method of claim 15, wherein the planarization material comprise one or more selected from: benzocyclobutene; perhydropolysilazene, $SiO_2$, parylene and/or polyimide.

20. The method of claim 15, wherein at least part of the object holder to which the planarization layer is provided is repellent to a material used to form the planarization layer.

* * * * *